US012772395B2

(12) United States Patent
Liao et al.

(10) Patent No.: US 12,772,395 B2
(45) Date of Patent: Oct. 20, 2026

(54) DISPLAY SYSTEM

(71) Applicant: AUO Corporation, Hsinchu City (TW)

(72) Inventors: Li-Yuan Liao, Hsinchu City (TW); Chien-Hsin Lin, Hsinchu City (TW); Tsung-Jung Pan, Hsinchu City (TW); Yang-Ju Ou, Hsinchu City (TW); Hsin-Li Chen, Hsinchu City (TW)

(73) Assignee: AUO CORPORATION, Hsinchu City (TW)

(*) Notice: Subject to any disclaimer, the term of this patent is extended or adjusted under 35 U.S.C. 154(b) by 105 days.

(21) Appl. No.: 18/940,213

(22) Filed: Nov. 7, 2024

(65) Prior Publication Data

US 2025/0159820 A1 May 15, 2025

(30) Foreign Application Priority Data

Nov. 10, 2023 (TW) ................................ 112143460

(51) Int. Cl.
*F16B 5/02* (2006.01)
*H05K 5/02* (2006.01)

(52) U.S. Cl.
CPC ......... *H05K 5/0217* (2013.01); *F16B 5/0233* (2013.01)

(58) Field of Classification Search
None
See application file for complete search history.

(56) References Cited

U.S. PATENT DOCUMENTS 10,239,115 B2 * 3/2019 Hornbostel ........... F16B 19/086
10,626,961 B2 * 4/2020 Heo ...................... G09F 9/3026
10,653,021 B2 * 5/2020 Kim ......................... H05K 5/30
11,020,818 B2 * 6/2021 Brandau ................... F16B 5/08
11,140,467 B2 * 10/2021 Choi ...................... H04R 1/028
11,184,986 B2 * 11/2021 Heo ......................... H05K 5/03
11,268,552 B2 * 3/2022 Clavelle ................ F16B 37/045
11,873,853 B2 * 1/2024 Bentrim ................ F16B 21/065

(Continued)

FOREIGN PATENT DOCUMENTS

CN 110689821 A 1/2020
CN 111779933 A * 10/2020 ........... F16M 13/005

(Continued)

*Primary Examiner* — Xanthia C Relford

(74) *Attorney, Agent, or Firm* — WPAT, PC

(57) ABSTRACT

A display system including a supporting mechanism, a display panel and a plurality of adjusting components is disclosed. The supporting mechanism has a supporting surface, and the display panel is disposed on the supporting surface of the supporting mechanism. Each of the plurality of adjusting components includes a base cylinder, an adjusting seat and a connecting element. One end of the base cylinder is disposed on the display panel or the supporting mechanism. The adjusting seat is telescopically disposed on the other end of the base cylinder relative to the base cylinder, and the adjusting seat has a set of grooves. The set of grooves is distributed on a radial direction of an axis of the adjusting seat, and the set of grooves is driven by an external force to rotate around the axis of the adjusting seat and the adjusting seat is telescopic relative to the base cylinder. The connecting element is disposed in the adjusting seat, and the connecting element can be connected separably to the other of the display panel or the supporting mechanism.

21 Claims, 11 Drawing Sheets

(56) References Cited

U.S. PATENT DOCUMENTS

| | | | | |
|---|---|---|---|---|
| 12,098,822 | B2 | 9/2024 | Liao | |
| 2006/0280579 | A1 * | 12/2006 | Seidl | F16B 5/0233 411/546 |
| 2009/0263207 | A1 * | 10/2009 | Christ | B23K 35/0288 411/171 |
| 2010/0285318 | A1 * | 11/2010 | Pimper | B23K 9/207 428/411.1 |
| 2013/0094896 | A1 * | 4/2013 | Christ | F16B 5/08 403/267 |
| 2018/0031919 | A1 * | 2/2018 | Ryu | G02F 1/133603 |
| 2018/0099350 | A1 * | 4/2018 | Brandau | B23K 20/1295 |
| 2020/0057594 | A1 * | 2/2020 | Nakano | G06F 3/147 |
| 2023/0341111 | A1 * | 10/2023 | Liao | F21V 17/12 |

FOREIGN PATENT DOCUMENTS

| | | | | |
|---|---|---|---|---|
| CN | 212302949 | U | 1/2021 | |
| DE | 102011012954 | A1 * | 8/2012 | A63H 33/101 |
| TW | 202342919 | A | 11/2023 | |

* cited by examiner

DISPLAY SYSTEM

BACKGROUND

Cross-Reference to Related Application

This application claims the priority benefit of Taiwan application serial no. 112143460 filed on Nov. 10, 2023. The entirety of the above-mentioned patent application is hereby incorporated by reference herein and made a part of this specification.

TECHNICAL FIELD

The present disclosure relates to a display system, and in particular to a display system that can achieve improvement of an adjustment mechanism for instant online adjustment and adjustment time without dismounting a module in a display panel splicing process or under the adjustment of adjacent high-low offset according to a splicing requirement.

RELATED ART

A panel display system has high product advantages, such as high brightness, high contrast, high color gamut and wide viewing angle. In response to the development requirements of different fields, the development of the display panel display system is not limited to plane splicing, but also applied to the development of display systems with modeling, as well as to various film and television entertainment.

For example, when the panel display system is applied to a spherical display system or a large-scale display system, it is needed to splice a plurality of panels. The spherical or large-scale display system is composed of panels with supporting components, but a visual effect may be affected by the processing difference of each panel and high-low offset caused by assembly accumulation in panel splicing. However, it is not easy and time-consuming to adjust the offset between adjacent panels mentioned above. Therefore, the improvement of an adjustment mechanism of the display panel of the display system and the time required for adjustment are technical problems to be urgently solved.

SUMMARY

In order to solve the above technical problem, an embodiment of the present disclosure provides a display system, including a supporting mechanism, a display panel and a plurality of adjusting components. The supporting mechanism has a supporting surface, and the display panel is disposed on the supporting surface of the supporting mechanism. Each of the plurality of adjusting components includes a base cylinder, an adjusting seat and a connecting element. One end of the base cylinder is disposed on the display panel or the supporting mechanism. The adjusting seat is telescopically disposed on the other end of the base cylinder relative to the base cylinder, and the adjusting seat has a set of grooves. The set of grooves is distributed on a radial direction of an axis of the adjusting seat, and the set of grooves is driven by an external force to rotate around the axis of the adjusting seat and the adjusting seat is telescopic relative to the base cylinder. The connecting element is disposed in the adjusting seat, and the connecting element can be connected separably to the other of the display panel or the supporting mechanism.

An embodiment of the present disclosure further provides a display system, including a supporting mechanism, a display panel and a plurality of adjusting components. The supporting mechanism has a supporting surface, and the display panel is disposed on the supporting surface of the supporting mechanism. Each of the plurality of adjusting components includes a base cylinder, an adjusting seat and a connecting element. One end of the base cylinder is disposed on the display panel or the supporting mechanism, and the base cylinder has a base cylinder outer surface thread. The adjusting seat has a hole for the base cylinder to extend into, an inner wall of the hole has an adjusting seat inner surface thread corresponding to the base cylinder outer surface thread, and a length of the adjusting component is adjusted by rotating the adjusting seat. The connecting element is disposed on the adjusting seat, and the connecting element can be connected separably to the other of the display panel or the supporting structure.

The advantages of the embodiment of the present invention compared with the prior art are described below.

According to the display system provided by the embodiment of the present disclosure, the grooves in the adjusting seat are driven by an external force to drive the adjusting seat to rotate so as to be telescopic relative to the base cylinder, and the offset among all panels can be adjusted in a status that the display panels are not dismounted from the display system.

According to the display system provided by another embodiment of the present disclosure, the length of the adjusting components can be adjusted by rotating the base cylinder outer surface thread and the corresponding adjusting seat inner surface thread, and the offset among all panels can be adjusted in a status that the display panels are not dismounted from the display system.

BRIEF DESCRIPTION OF THE DRAWINGS

In order to make the above and other purposes, features, advantages and embodiments of the present disclosure more obvious and easier to be understood, the attached accompanying drawings are described as follows.

DETAILED DESCRIPTION

Various embodiments will be described in the description, and a person having ordinary skill in the art should easily understood the spirit and principles of the present disclosure with reference to the description and the accompanying drawings. Here, each element or part drawn in each accompanying drawing may be exaggerated or varied for clarity. Therefore, a person having ordinary skill in the art should understand that the dimensions and relative proportions of each element or part drawn in the accompanying drawing are not the actual dimensions and relative proportions of the element or part. In addition, although some specific embodiments are specified here, they are illustrative only and are not considered to be restrictive or exhaustive in all respects. Therefore, for a person having ordinary skill in the art, various changes and modifications to the present disclosure should be obvious and easily achievable without departing from the spirit and principles of the present disclosure.

It is to be understood that although the terms “first”, “second”, “third”, etc., may be used herein for describing various elements, components, regions, layers and/or parts, such elements, components, regions, and/or parts shall not be limited by these terms. These terms are used only for distinguishing one element, component, region, layer, or part from another element, component, region, layer or part. Therefore, the “first element”, “component”, “region”, “layer”, or “part” discussed below can be referred to as the second element, component, region, layer, or part without departing from the teachings of the present disclosure.

Figure 1:
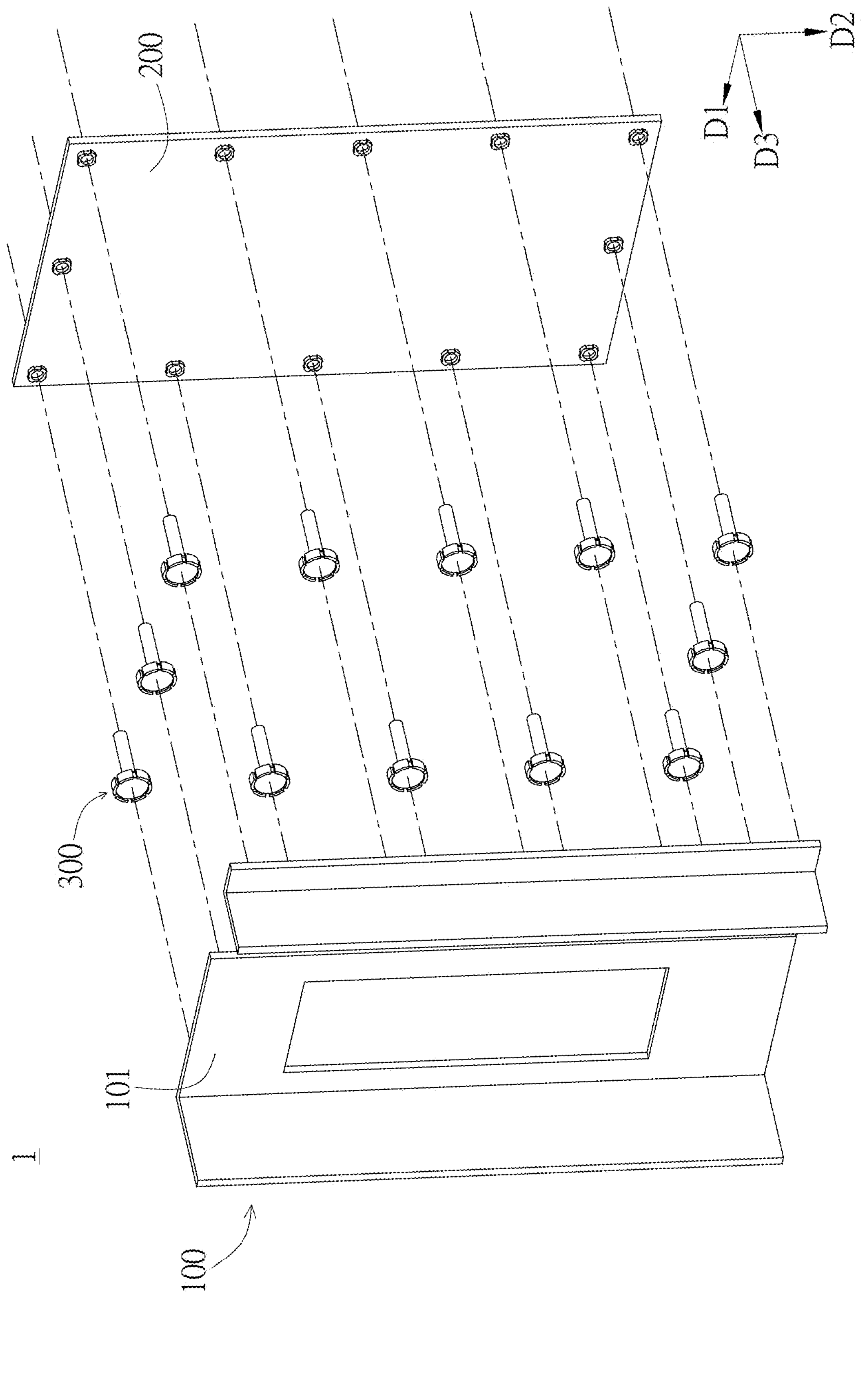
FIG. 1 is an exploded view of a supporting mechanism, a display panel and an adjusting component including a base cylinder, an adjusting seat and a connecting element according to Embodiment 1 of the present disclosure.
Figure 2:
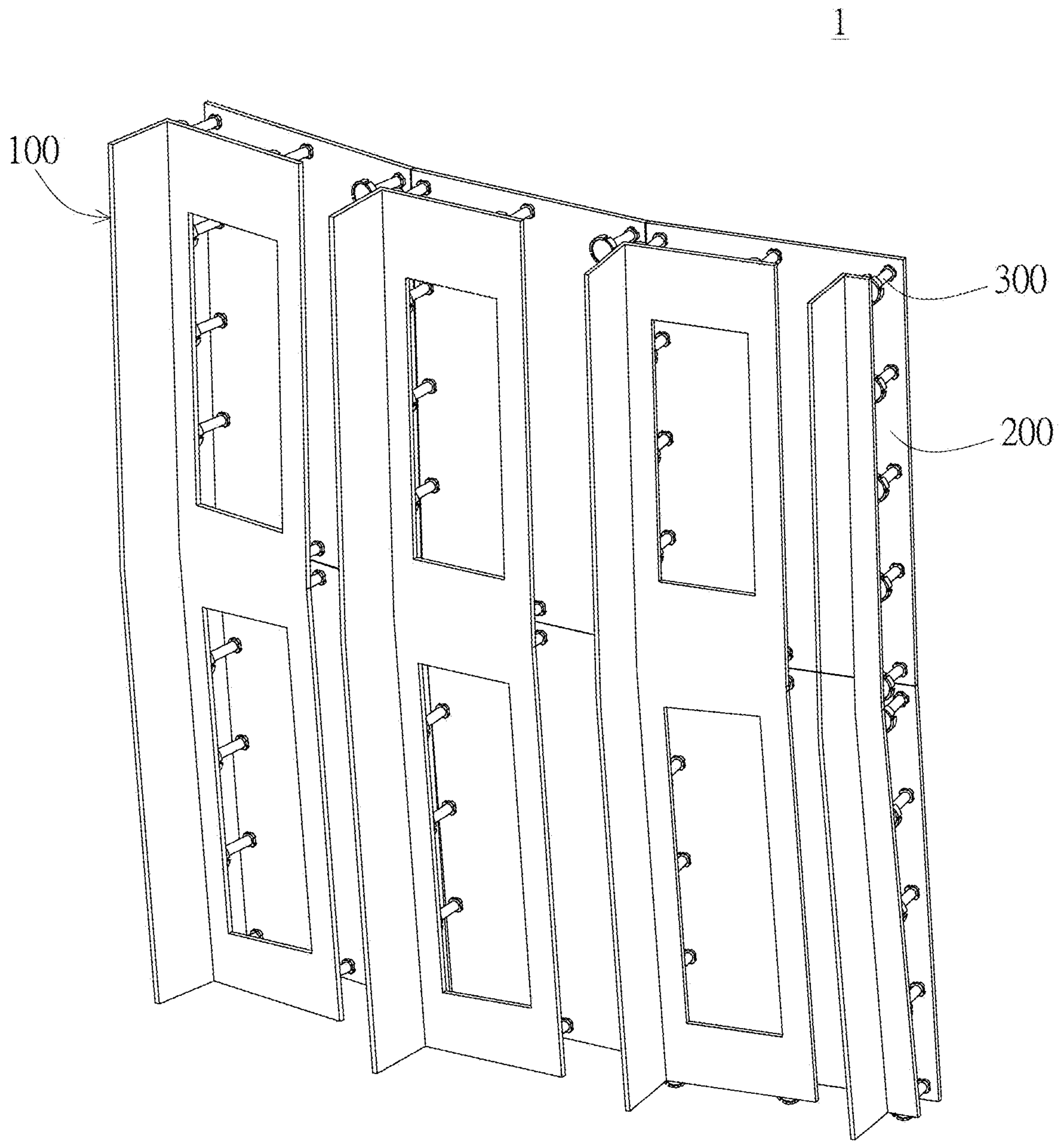
FIG. 2 is a local schematic diagram of a display system after assembly according to Embodiment 1 of the present disclosure.

Referring to FIG. 1 and FIG. 2, FIG. 1 is an exploded view of a supporting mechanism, a display panel and an adjusting component including a base cylinder, an adjusting seat and a connecting element according to Embodiment 1 of the present disclosure, and FIG. 2 is a local schematic diagram of a display system after assembly according to Embodiment 1 of the present disclosure. The display system 1 according to the Embodiment 1 of the present disclosure includes a supporting mechanism 100, a display panel 200 and a plurality of adjusting components 300 shown in FIG. 1.

The supporting mechanism 100 has a supporting surface 101, and the display panel 200 is disposed on the supporting surface 101 of the supporting mechanism 100. The supporting mechanism 100 preferably includes supports in different directions, and the supporting surface 101 can be a surface of the support. The display panel 200 preferably includes various display panels, such as a liquid crystal display panel, a micro light-emitting diode display panel, a mini light-emitting diode display panel, and an organic light-emitting diode display panel; and in addition, the display panel 200 can also be a backplane, a mounting plate or a supporting plate of various display panels.

Figure 3A:
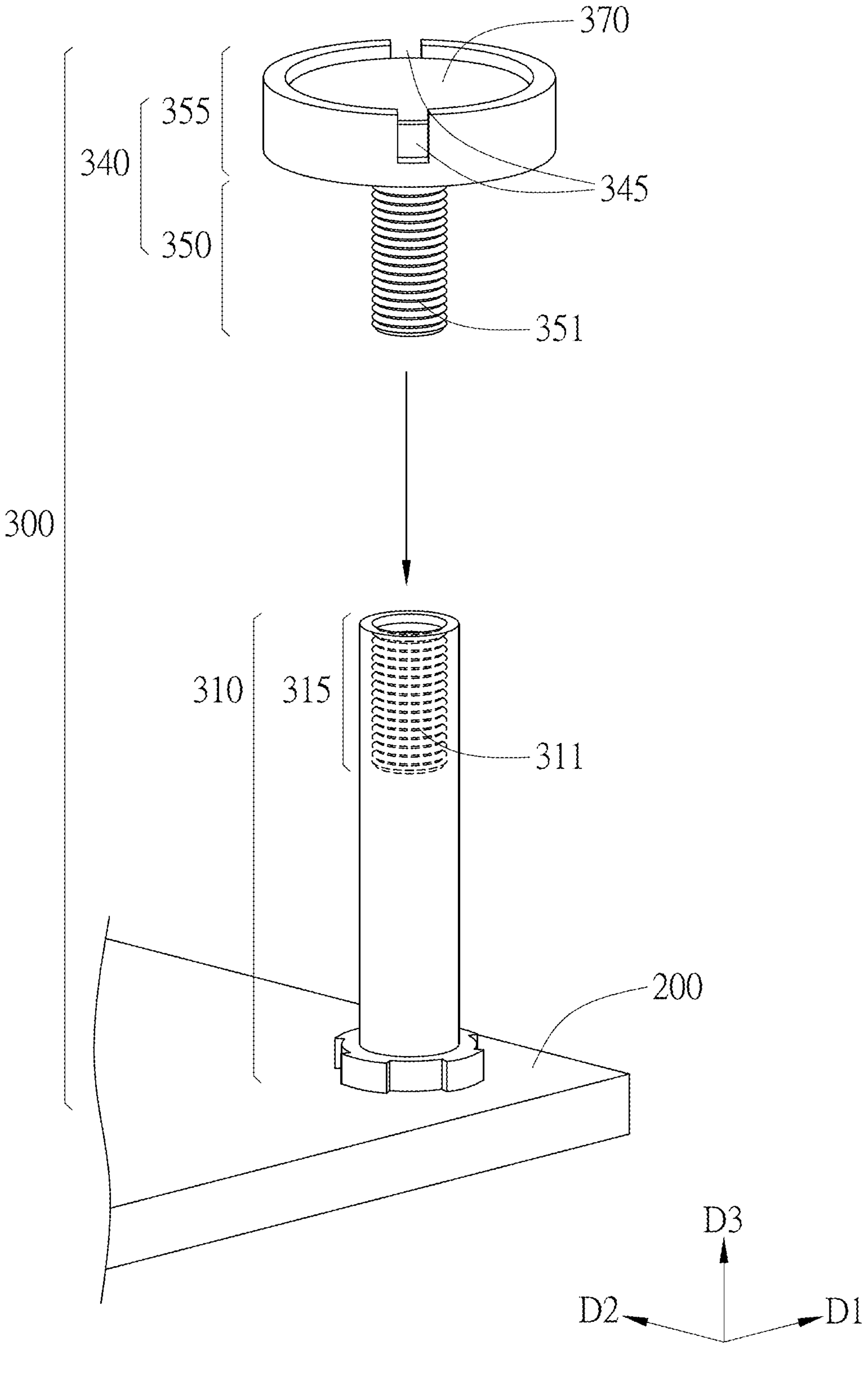
FIG. 3A is a schematic structural diagram of an adjusting seat and a base cylinder according to Embodiment 1 of the present disclosure.
Figure 3B:
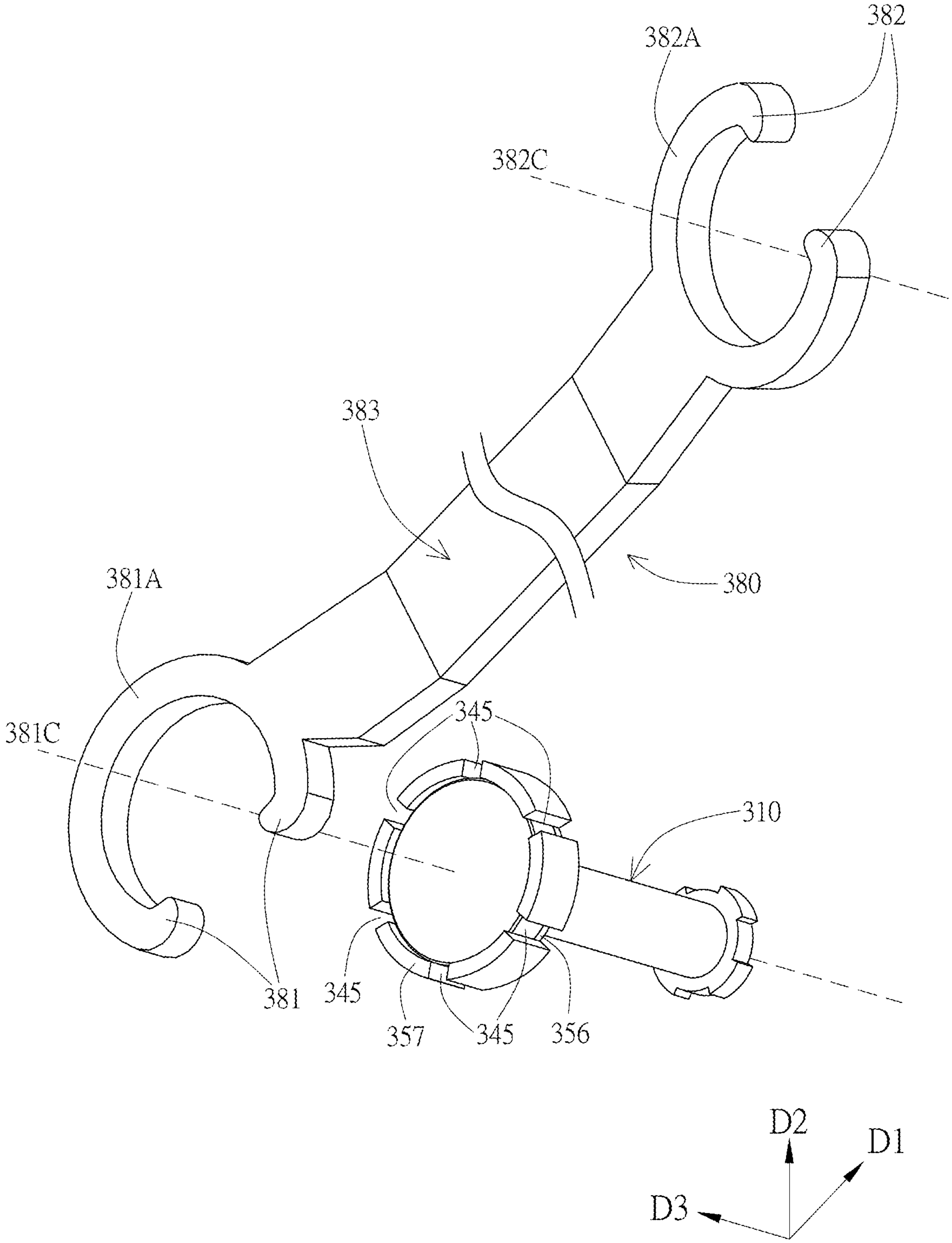
FIG. 3B is a schematic structural diagram of an adjusting seat, a base cylinder and an adjusting jig according to Embodiment 1 of the present disclosure.
Figure 3C:
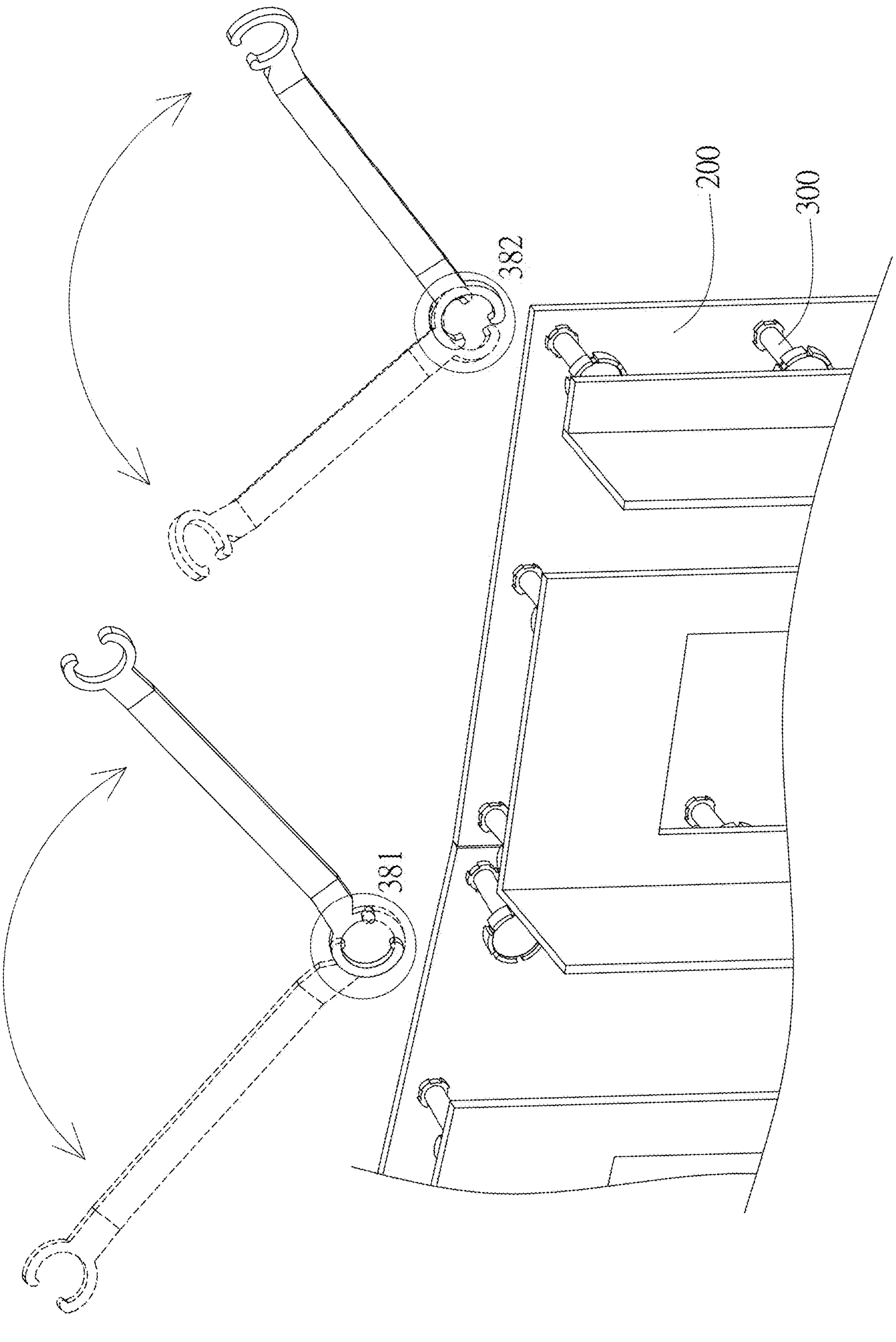
FIG. 3C is an operation schematic diagram of an adjusting jig, an adjusting seat and a base cylinder according to Embodiment 1 of the present disclosure.

The detail structures in each adjusting component 300 may refer to FIG. 3A to FIG. 3C, FIG. 3A is a schematic structural diagram of an adjusting seat and a base cylinder according to Embodiment 1 of the present disclosure, FIG. 3B is a schematic structural diagram of an adjusting seat, a base cylinder and an adjusting jig according to Embodiment 1 of the present disclosure, and FIG. 3C is an operation schematic diagram of an adjusting jig, an adjusting seat and a base cylinder according to Embodiment 1 of the present disclosure.

Each adjusting component 300 includes a base cylinder 310, an adjusting seat 340 and a connecting element 370. One end of the base cylinder 310 is disposed on the display panel 200, and the adjusting seat 340 is telescopically disposed on the other end of the base cylinder 310 relative to the base cylinder 310. The adjusting seat 340 has a set of grooves 345, and the set of grooves 345 is distributed on a radial direction of an axis of the adjusting seat 340, such as a first direction D1 or a second direction D2 in FIG. 3A.

The set of grooves 345 is driven by an external force to drive the adjusting seat 340 to rotate around the axis and the adjusting seat is telescopic relative to the base cylinder 310, that is, the grooves 345 rotate with a third direction D3 in FIG. 1 as the axis, and the adjusting seat 340 is driven to move in a direction parallel to the third direction D3. The connecting element 370 is disposed on the adjusting seat 340, and the connecting element 370 is connected separably to the supporting mechanism 100.

In the Embodiment 1 shown in FIG. 2, each adjusting component 300 in the assembled display system 1 is connected to the supporting mechanism 100 through the connecting element 370. In other words, one end of the base cylinder 310 is fixed to the display panel 200, and the other end of the base cylinder 310 is provided with the adjusting seat 340 in the adjusting component 300; the adjusting seat 340 is provided with the connecting element 370 to be connected to the supporting mechanism 100, for example, the connecting element 370 is a magnet to be magnetically connected to the supporting mechanism 100, and the supporting mechanism 100 is a support made of a material that can be attracted by the magnet. However, the configuration of the supporting mechanism 100 and the configuration of the display panel 200 can be interchanged and are not limited to the implementation in FIG. 2. It is to be noted that a number of the adjusting components 300 disposed in each display panel 200 in the embodiment shown in FIG. 1 is not limited to a number shown in FIG. 1. Moreover, a number of the display panels 200 of the display system in the embodiment shown in FIG. 2 is not limited to a number shown in FIG. 2.

In FIG. 3A, the adjusting seat 340 of each adjusting component 300 may be implemented to include a shaft rod 350 and a seat stand 355, and the shaft rod 350 extends towards in a direction of the base cylinder 310. The base cylinder 310 of each adjusting component 300 may be implemented to have a shaft hole 315 corresponding to a structure of the shaft rod 350 of the adjusting seat 340. As shown in FIG. 3A, the adjusting seat 340 can extend into the shaft hole 315 of the base cylinder 310 along the third direction D3 by way of the structure of the shaft rod 350.

Further, the shaft rod 350 of the adjusting seat 340 and the shaft hole 315 of the base cylinder 310 respectively have finer structures so as to finely adjust a distance between the display panel 200 and the supporting mechanism 100 in the third direction D3, thereby eliminating the step between adjacent display panels 200. For example, the shaft rod 350 may be implemented to have a shaft rod outer surface thread

351, and an inner wall of the shaft hole 315 may be implemented to have a base cylinder inner surface thread 311 corresponding to the shaft rod outer surface thread 351.

When rotating the adjusting seat 340, the adjusting seat 340 can be controlled to move along a direction parallel to an extension direction of the base cylinder 310 by way of the shaft rod outer surface thread 351 and the base cylinder inner surface thread 311. For example, when the adjusting seat 340 rotates clockwise with the third direction D3 as the axis, a position of the adjusting seat 340 is close to the display panel 200. That is, the distance between the adjusting component 300 and the supporting mechanism 100 is shortened. On the contrary, when the adjusting seat 340 rotates counterclockwise with the third direction D3 as the axis, the position of the adjusting seat 340 is far away from the display panel 200, so that the distance between the adjusting component 300 and the supporting mechanism 100 is extended.

Considering a difficulty level of processing the shaft rod 350 and the base cylinder 310 and an operation convenience level of the adjusting seat 340, a configuration mode of the above shaft rod outer surface thread 351 and the base cylinder inner surface thread 311, for example, a length of the thread part, is preferably configured such that a length of the base cylinder inner surface thread 311 in the extension direction of the base cylinder (namely the third direction D3) is less than or equal to 50% of the length of the base cylinder 310. For example, the length of the base cylinder 310 in the third direction D3 is 20-25 millimeters, and the length of the base cylinder inner surface thread 311 in the third direction D3 is 10-12.5 millimeters.

Correspondingly, a length of the shaft rod outer surface thread 351 in the extension direction of the base cylinder is preferably configured to be less than or equal to 85% of the length of the base cylinder inner surface thread 311 in the extension direction of the base cylinder. For example, the length of the shaft rod outer surface thread 351 in the third direction D3 is 8.5-10.5 millimeters. However, the configuration of the shaft rod outer surface thread 351 and base cylinder inner surface thread 311 is not limited to the above implementation. According to a preset distance between the adjusting component 300 and the supporting mechanism 100, the length configuration of the shaft rod outer surface thread 351 and the base cylinder inner surface thread 311 can be flexibly adjusted.

Then, in order to adjust the offset between the display panels 200 in a labor-saving and time-saving manner without dismounting the display panels 200 from the display system 1, each adjusting seat 340 can be implemented in match with the adjusting jig 380. In FIG. 3B, the seat stand 355 of each adjusting seat 340 can be implemented to include a base 356 and an outer wall 357, the base 356 is connected to the shaft rod 350, the outer wall 357 extends out from an edge of the base 356 in a direction opposite to the base cylinder 310, namely in a direction opposite to the shaft rod 350; and the outer wall 357 defines an accommodating space to accommodate the connecting element 370. Moreover, a plurality of grooves 345 of the adjusting seat 340 can be provided, and are preferably distributed in an outer periphery of the seat stand 355 at equal-angle intervals. In other words, the plurality of grooves 345 are distributed in the outer wall 357 of the seat stand 355.

The detailed structure of the adjusting jig 380 is further described, the flatness of the display panels 200 is adjusted in match with the grooves 345 of the adjusting seat 340. In FIG. 3B, the adjusting jig 380 has a first engagement part 381; and the first engagement part 381 can be implemented to various shapes corresponding to the structures of the grooves 345 so as to be engaged with the grooves 345, thereby rotating the adjusting seat 340.

For example, as shown in FIG. 3B, more than two grooves 345 are formed in the outer wall 357 of the seat stand 355 of the adjusting seat 340, and at least one groove 345 penetrates through a top end and a bottom end of the outer wall 357. In other words, the grooves 345 penetrate through the outer wall 357 in the third direction D3, namely the outer wall 357 is cut into a plurality of sections; and the grooves 345 are sunken towards an interior of the seat stand 355 in the first direction D1 or the second direction D2. By way of such design, the first engagement part 381 can enter the grooves 345 in the third direction D3 and be engaged with the grooves.

Correspondingly, the first engagement part 381 of the adjusting jig 380 in FIG. 3B is composed of two protruded first clamping units that can be engaged with two of the grooves 345, and therefore the adjusting seat 340 is rotated around the first engagement part 381 along a first center 381C of the third direction D3; and the adjusting jig 380 further has a second engagement part 382, the second clamping units of the second engagement part 382 can be engaged with two of the grooves 345, and therefore the adjusting seat 340 is rotated around the second engagement part 382 along a second center 382C of the third direction D3. Specifically, the adjusting jig 380 has a main body 383, a first end and a second end, and the main body 383 is connected to the first end and the second end with the first direction D1 as the extension direction. The first engagement part 381 is located at the first end, and the second engagement part 382 is located at the second end.

However, the implementations of the grooves 345 and the adjusting jig 380 are not limited to the above implementations. For example, in the implementation in FIG. 3A, two grooves 345 are formed in the outer wall 357 of the seat stand 355 of the adjusting seat 340. The difference from the shape of the grooves 345 in FIG. 3B is that the grooves 345 in FIG. 3A do not penetrate through the outer wall 357 in the third direction D3, but partially extend from the top end of the outer wall 357 of the seat stand 355 to the bottom end.

In other words, the opening shape of the grooves 345 in FIG. 3B extends from an area between the top end and the bottom end of the outer wall 357 to the top end of the outer wall 357 in the direction opposite to the base cylinder 310, and an opening is formed in a radial outward direction of the outer wall 357. In the same way, the opening shape of the grooves 345 can extend from the area between the top end and the bottom end of the outer wall 357 to the bottom end of the outer wall 357 in the direction toward the base cylinder 310, and an opening (not shown in the figure) is formed in the radial outward direction of the outer wall 357.

In addition, the second engagement part 382 of the adjusting jig 380 also has different implementations. For example, two protruded second clamping units of the second engagement part 382 in FIG. 3B are distributed at different angles in the radial direction of the axis of the adjusting seat 340. Specifically, a direction of a connecting line of two protruded structures of the second engagement part 382 is a second angle, a direction of a connecting line of two protruded structures of the first engagement part 381 is a first angle, and the first angle is different from the second angle.

According to the implementation that the first engagement part 381 and the second engagement part 382 are distributed at different angles in the radial direction of the axis of the adjusting seat 340, a first bending arm 381A can be disposed at the first engagement part 381 of the first end of the adjusting jig 380, and a second bending arm 382A can be disposed at the second engagement part 382 of the second end. Specifically, the two protruded structures of the first engagement part 381 are distributed at a tail end of the first bending arm 381A to define a first opening, and the two protruded structures of the second engagement part 382 are distributed at a tail end of the second bending arm 382A to define a second opening. In addition, an included angle between the opening direction of the first opening and the first direction D1 is different from an included angle between the opening direction of the second opening and the first direction D1. However, the implementation that the first engagement part 381 and the second engagement part 382 are distributed at different angles in the radial direction of the axis of the adjusting seat 340 is not limited to the above implementation of the bending arms, and can be the implementation of structures in various shapes.

The different implementations of the engagement parts of the adjusting jig 380 can be applied in different space limits. In FIG. 3C, all adjusting components 300 are distributed on the display panel 200 at different intervals, and when the interval between the adjacent adjusting components 300 is small, the second engagement part 382 of the adjusting jig 380 is used for adjusting the flatness of the display panels. On the contrary, when the interval between the adjacent adjusting components 300 is large, the first engagement part 381 of the adjusting jig 380 can be used for adjusting the flatness of the display panels.

The Embodiment 2 of the present disclosure is described below, the implementation of the adjusting component 300 is not only to adjust the flatness of the display panel 200 through the adjusting jig 380, but also to provide different elements to the adjusting components 300, and adjust the deviation of the display panel 200 by manually or other tools.

Figure 4A:
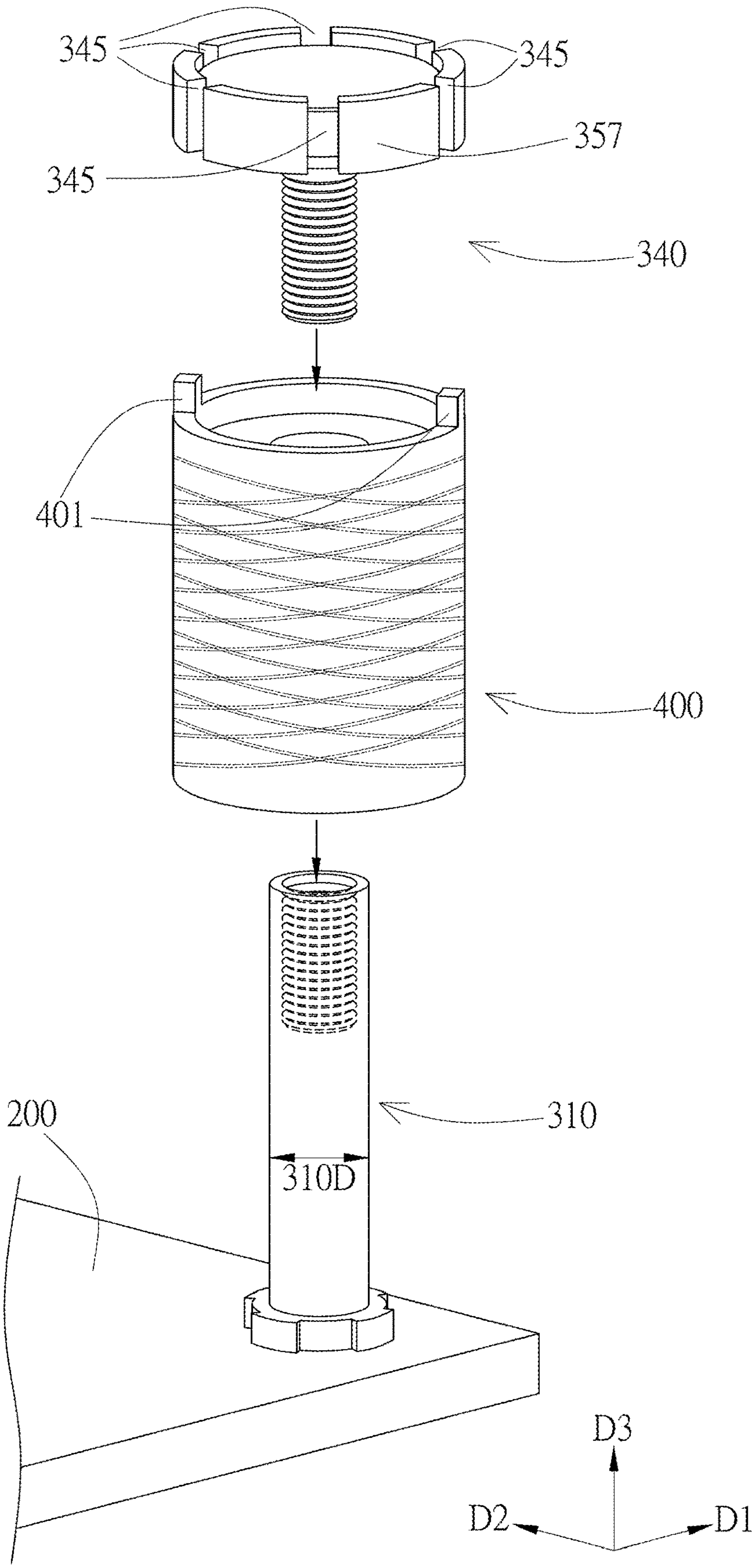
FIG. 4A is an exploded view of a display panel and an adjusting component including a base cylinder, an adjusting seat, a sleeve and a connecting element in a display system according to Embodiment 2 of the present disclosure.
Figure 4B:
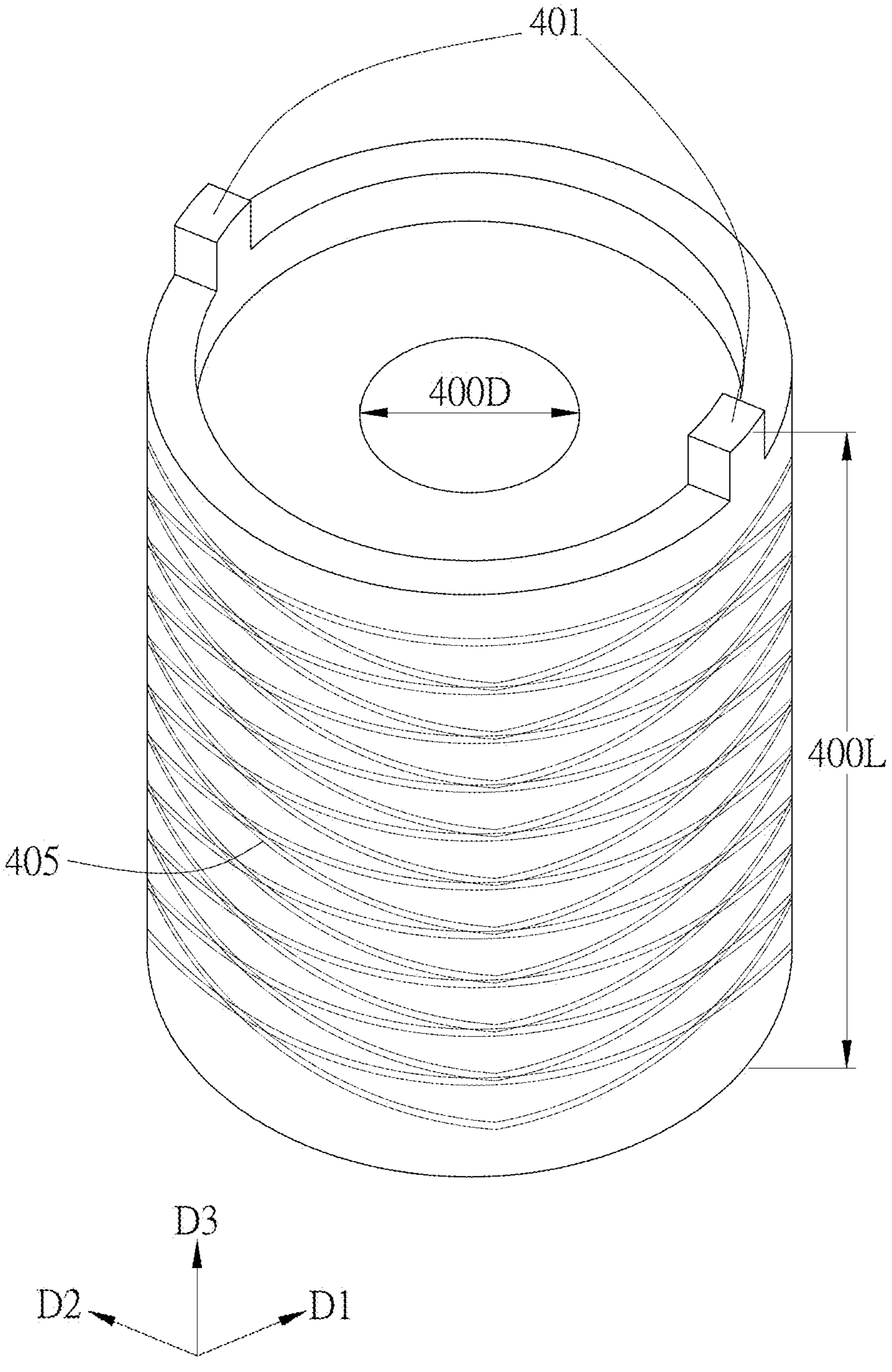
FIG. 4B is a schematic structural diagram of a sleeve according to Embodiment 2 of the present disclosure.
Figure 4D:
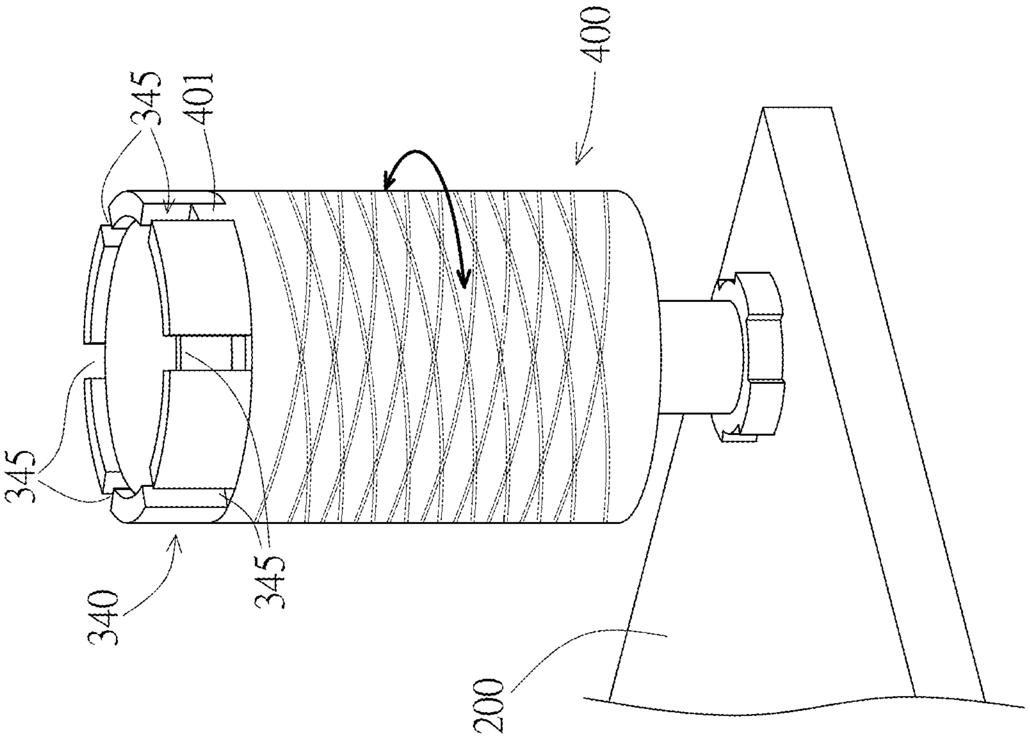
FIG. 4D is an operation schematic diagram of a sleeve and a groove in a combined state according to Embodiment 2 of the present disclosure.
Figure 4C:
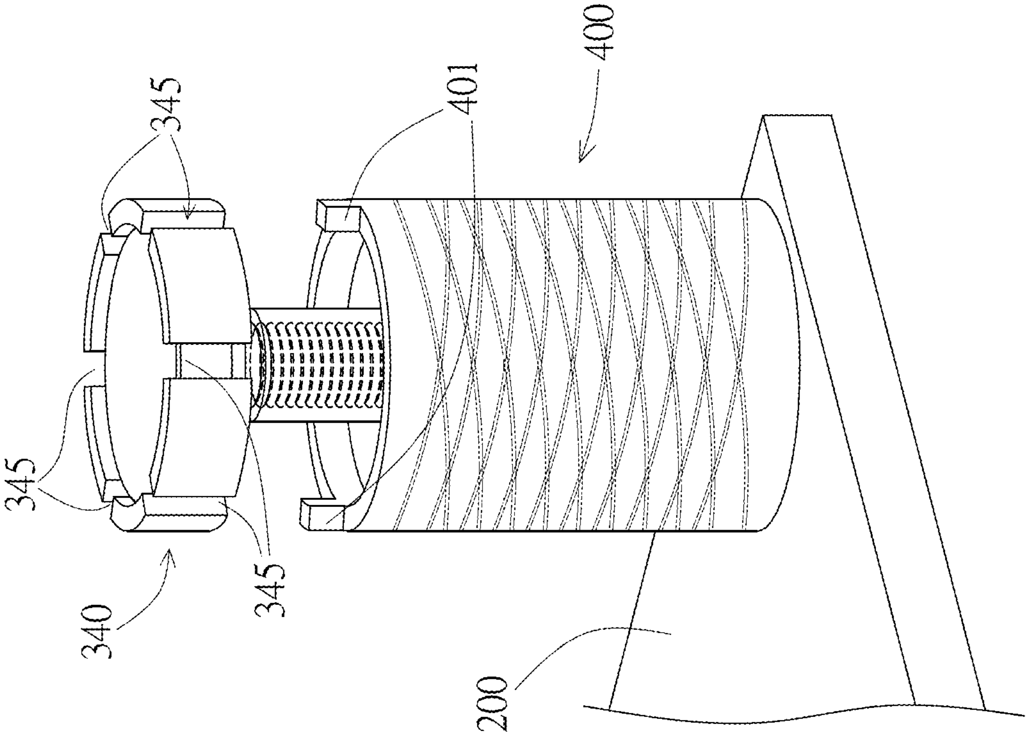
FIG. 4C is an operation schematic diagram of a sleeve and a groove in a non-combined state according to Embodiment 2 of the present disclosure.
Figure 4E:
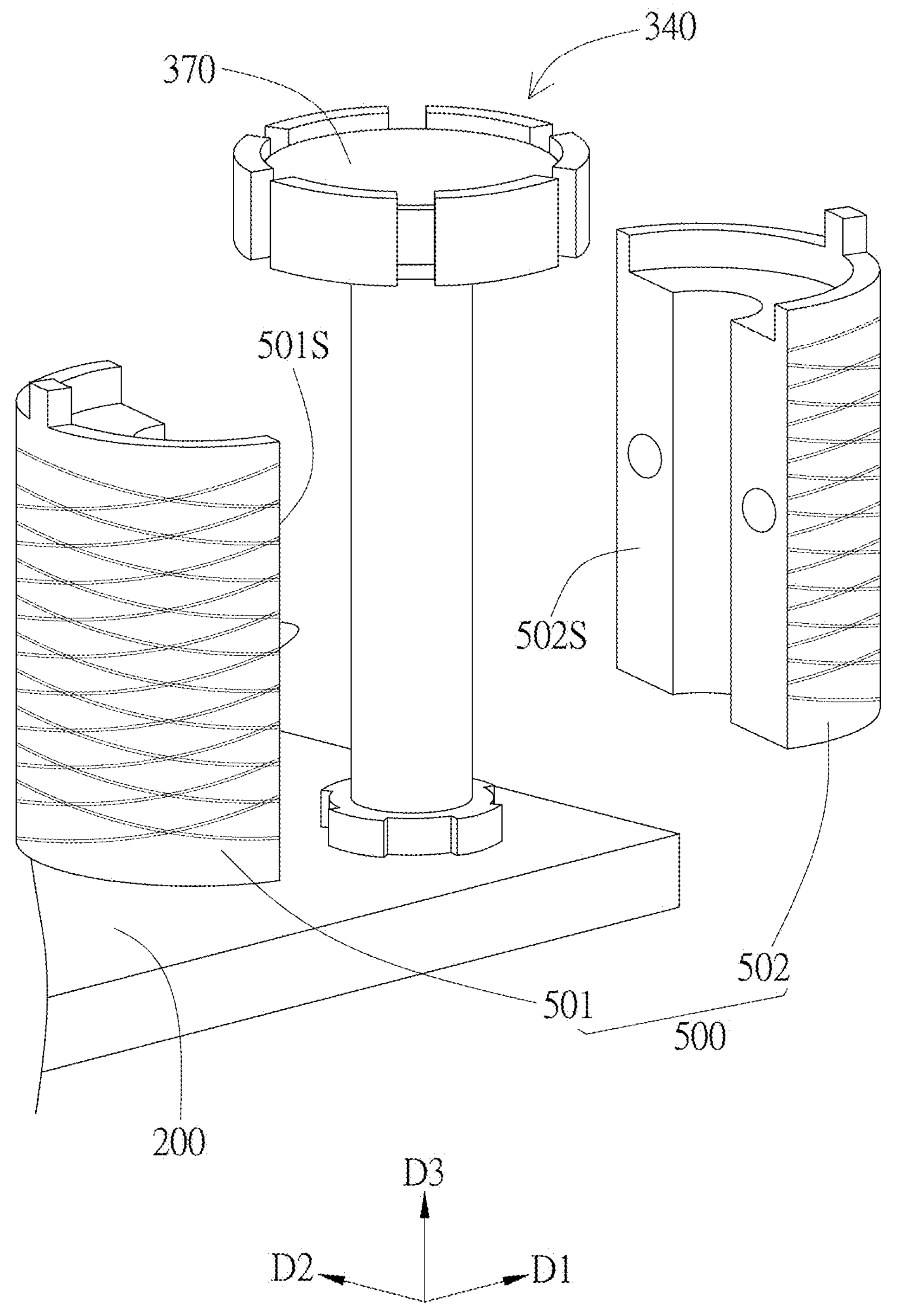
FIG. 4E is an exploded view of a display panel and an adjusting component including a base cylinder, an adjusting seat, a combined sleeve and a connecting element in a display system according to Embodiment 2 of the present disclosure.

Referring to FIG. 4A to FIG. 4E, FIG. 4A is an exploded view of a display panel and an adjusting component including a base cylinder, an adjusting seat, a sleeve and a connecting element in a display system according to Embodiment 2 of the present disclosure, FIG. 4B is a schematic structural diagram of a sleeve according to Embodiment 2 of the present disclosure, FIG. 4C is an operation schematic diagram of a sleeve and a groove in a non-combined state according to Embodiment 2 of the present disclosure, FIG. 4D is an operation schematic diagram of a sleeve and a groove in a combined state according to Embodiment 2 of the present disclosure, and FIG. 4E is an exploded view of a display panel and an adjusting component including a base cylinder, an adjusting seat, a combined sleeve and a connecting element in a display system according to Embodiment 2 of the present disclosure.

In the Embodiment 2 of the present disclosure, each adjusting component 300 further includes a sleeve 400, and the implementations of the base cylinder 310, the adjusting seat 340 and the grooves 345 of the adjusting component 300 are similar to those in the Embodiment 1, and will not be repeated here. In FIG. 4A, the sleeve 400 can movably sleeve the base cylinder 310 in the extension direction of the base cylinder 310. Moreover, the sleeve 400 includes at least one engagement part 401, and the engagement part 401 of the sleeve 400 can be engaged with at least one of the grooves 345.

The implementations of the sleeve 400 and the engagement part 401 can refer to FIG. 4A and FIG. 4B. For example, the sleeve 400 in FIG. 4A is provided with two protruded engagement parts 401 at the end close to the grooves 345, there are more than two grooves 345 of the adjusting seat 340 in FIG. 4A, and the grooves 345 penetrate through the outer wall 357 in the third direction D3.

Therefore, the two engagement parts 401 of the sleeve 400 can be flexible combined with two of the grooves 345 of the adjusting seat 340, so that the sleeve 400 can be manually rotated, the adjusting seat 340 is driven to move in the third direction D3 and eliminating the deviation between two display panels 200. It is to be understood that the number of the engagement parts 401 of the sleeve 400 is not limited to the above implementation, for example, the number of the engagement parts 401 of the sleeve 400 can be less than or equal to the number of the grooves 345, and corresponds to the positions of the grooves 345 for use.

The size of the sleeve 400 relative to the base cylinder 310 can refer to FIG. 4A and FIG. 4B. In FIG. 4B, the length of the sleeve 400 in the third direction D3 is less than the length of the base cylinder 310 in the third direction D3. It is to be noted that the sleeve length 400L includes a length of the engagement part 401. In other words, a maximum length of the sleeve 400 is from the bottom of the sleeve 400 to the top of the engagement part 401.

Moreover, the sleeve 400 is a tubular structure having an inner diameter, and a size of the inner diameter 400D of the sleeve is larger than an outer diameter 310D of the base cylinder, so that the sleeve 400 can move between the display panel 200 and the seat stand 355 in the state that the sleeve sleeves the base cylinder 310. In order to conveniently manually rotate the sleeve 400, an outer surface of the sleeve 400 has textures 405 for increasing friction force. Further, the operation mode with the engagement of the sleeve 400 and the grooves 345 can refer to FIG. 4C and FIG. 4D.

In FIG. 4C. Before adjusting, the sleeve 400 is attached to the display panel 200, which indicates that the engagement part 401 is away from the grooves 345. For example, we can use the adjusting jig 380 to eliminate the offset between two panels 200 without using the sleeve 400 to adjust the deviation between the display panels 200. However, there is some space limitation between the support mechanism 100 and display panel 200.

In FIG. 4D, when there is an offset between two display panels 200, the engagement part 401 of the sleeve 400 can be combined with two grooves 345 manually rotated to eliminate the step instead of using the adjusting jig 380 in the above embodiment. For example, the offset between two display panels 200 can be roughly adjusted by adjusting jig 380, and fine-tuned by manually rotating the sleeve 400 to make the display panels 200 flat.

However, if the sleeve 400 is disposed on each adjusting component, the weight and cost of the whole display system will be increased. Therefore, the sleeve 400 can be selectively disposed on part of the adjusting components. Or, as shown in FIG. 4E below, a combined sleeve 500 formed by a plurality of components is disposed.

In FIG. 4E, the combined sleeve 500 is formed by a component 501 and a component 502, the component 501 and the component 502 are provided with a separation surface 501S and a separation surface 502S that correspond to each other in shape, and the separation surface 501S and the separation surface 502S extend from one end adjacent to the display panel 200 to the other end adjacent to the supporting mechanism 100. By way of this implementation, the combined sleeve 500 can be selectively disposed on part of the adjusting components, thus reducing the weight and cost of the display system. The operation mode of the combined sleeve 500 is similar to that of the above integrated sleeve 400, and will not be repeated here.

Figure 5A:
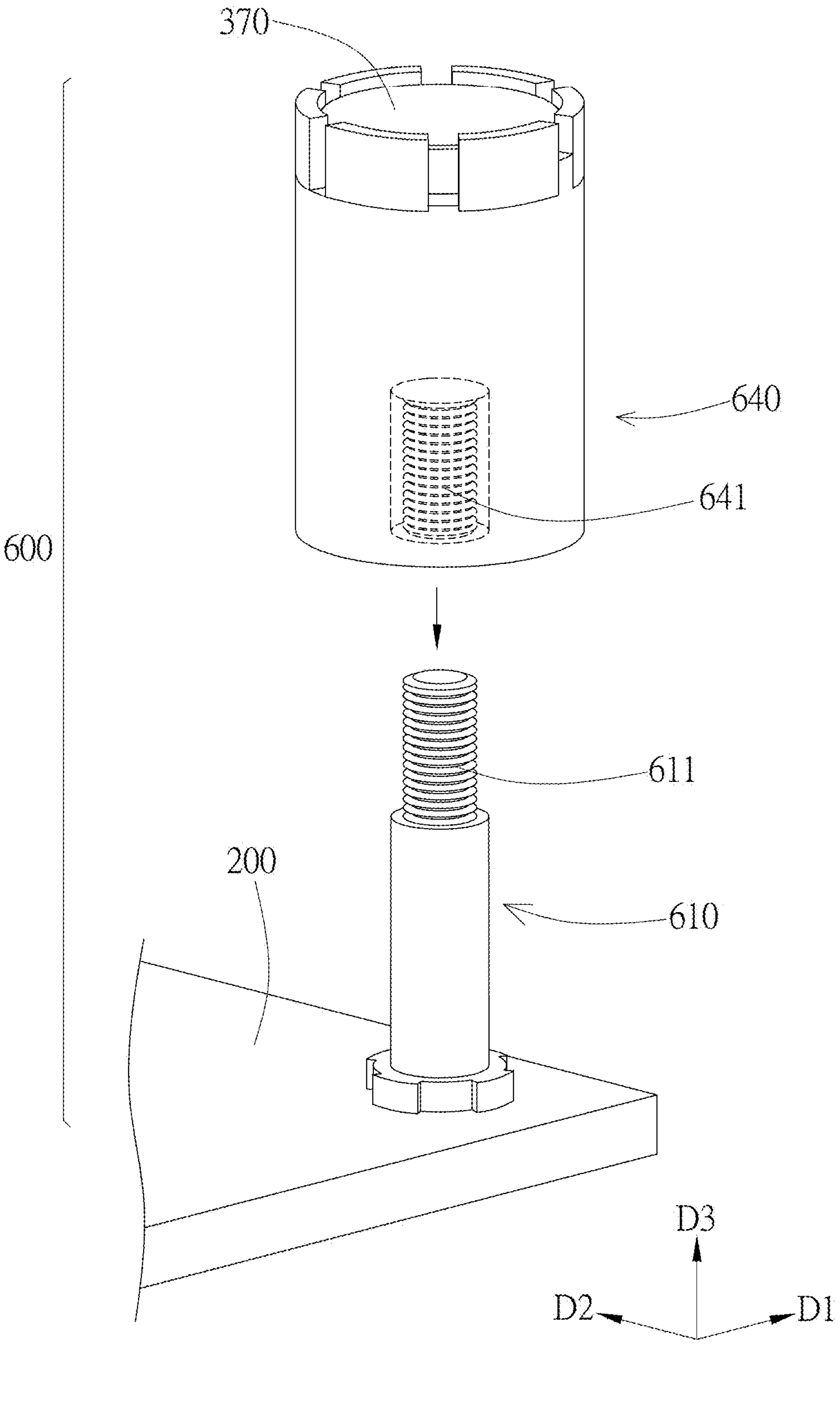
FIG. 5A is a schematic structural diagram of a display panel and an adjusting component including a base cylinder, an adjusting seat and a connecting element in a display system according to Embodiment 3 of the present disclosure.
Figure 5B:
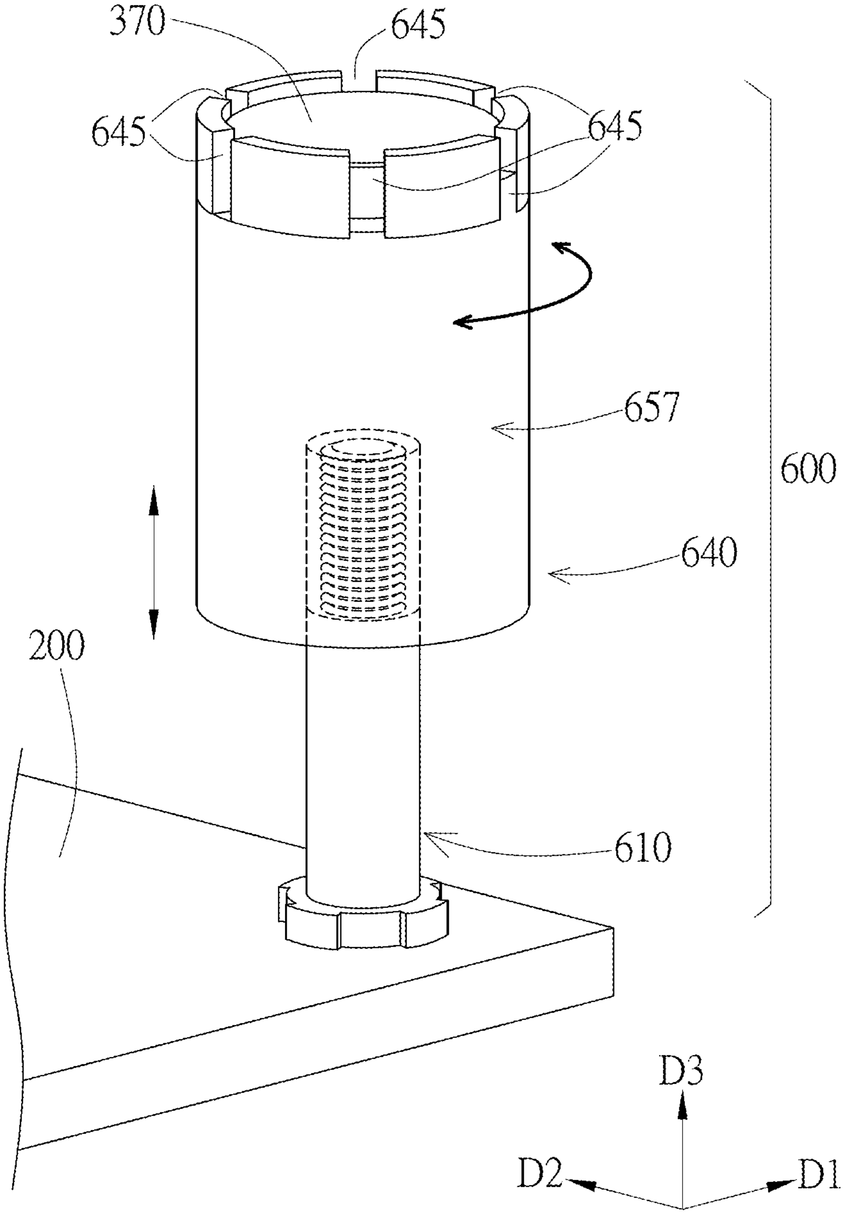
FIG. 5B is a schematic diagram of an adjusting seat and a base cylinder after assembly according to Embodiment 3 of the present disclosure.

Embodiment 3 of the present disclosure is described below with reference to FIG. 5A and FIG. 5B, FIG. 5A is a schematic structural diagram of a display panel 200 and an adjusting component 600 including a base cylinder 610, an adjusting seat 640 and a connecting element 370 in a display system according to Embodiment 3 of the present disclosure, and FIG. 5B is a schematic diagram of an adjusting seat 640 and a base cylinder 610 after assembly according to Embodiment 3 of the present disclosure.

In the Embodiment 3 of the present disclosure, the display system includes a supporting mechanism 100, a display panel 200 and a plurality of adjusting components 600. The supporting mechanism 100 has a supporting surface 101, and the display panel 200 is disposed on the supporting surface 101 of the supporting mechanism 100. Each of the plurality of adjusting components 600 includes a base cylinder 610, an adjusting seat 640 and a connecting element 370. One end of the base cylinder 610 is disposed on the display panel, and the base cylinder 610 has a base cylinder outer surface thread 611. The adjusting seat 640 is telescopically disposed on the other end of the base cylinder 610 relative to the base cylinder 610, the adjusting seat 640 has a hole for the base cylinder 610 to extend into, and an inner wall of the hole of the adjusting seat 640 has an adjusting seat inner surface thread 641 corresponding to the base cylinder outer surface thread 611, and a length of the adjusting component 600 is adjusted by rotating the adjusting seat 640. The connecting element 370 is disposed on the adjusting seat 640, and the connecting element 370 is connected separably to the supporting mechanism 100.

The structure and configuration of the supporting mechanism 100 and the display panel 200 in the Embodiment 3 of the present disclosure are the same as those in the Embodiment 1 and the Embodiment 2, which can refer to the description in FIG. 1 and FIG. 2 and will not be repeated here. The difference from the Embodiment 1 and the Embodiment 2 is that the adjusting components 600 in the Embodiment 3 is implemented to integrate the structure of the sleeve and the structure of the adjusting seat in the Embodiment 2 to enhance the convenience in operation. Moreover, the base cylinder inner surface thread and the shaft rod outer surface thread in the Embodiment 1 and the Embodiment 2 are implemented as the adjusting seat inner surface thread 641 and the base cylinder outer surface thread 611 in the Embodiment 3, thereby reducing the complexity of the whole structure.

In FIG. 5A, a size of the adjusting seat inner surface thread 641 and a size of the base cylinder outer surface thread 611 are similar to those of the base cylinder inner surface thread and the shaft rod outer surface thread in the Embodiment 1 and the Embodiment 2. For example, a length of the base cylinder outer surface thread 611 in the extension direction of the base cylinder 610 is smaller than or equal to 50% of the length of the base cylinder 610, and a length of the adjusting seat inner surface thread 641 in the extension direction of the base cylinder is smaller than or equal to 85% of the length of the base cylinder outer surface thread 611 in the extension direction of the base cylinder 610. However, the configurations of the base cylinder outer surface thread 611 and the adjusting seat inner surface thread 641 are not limited to the above implementation. According to a preset distance between the adjusting components 600 and the supporting mechanism 100, the length configuration of the base cylinder outer surface thread 611 and the adjusting seat inner surface thread 641 can be flexibly adjusted.

In FIG. 5B, similar to the adjusting seat in the Embodiment 1 and the Embodiment 2, the adjusting seat 640 includes an outer wall 657, and the outer wall defines an accommodating to accommodate the connecting element 370. In the Embodiment 3 of the present disclosure, the adjusting seat 640 also has a set of grooves 645 in a radial outward direction of the outer wall 657 so that the adjusting jig in the Embodiment 1 can adjust the offset between the display panels 200. Similarly, when a distance between adjacent adjusting components 600 is small, the adjusting seat 640 can be rotated manually to adjust the step between the display panels 200.

The foregoing is only some of the preferred embodiments of the present disclosure. It is to be noted that, without departing from the spirit and principles of the present disclosure, the present disclosure may be subject to various changes and modifications. A person having ordinary skill in the art should be aware that the present disclosure is defined by the claims of the attached patent application, and under the intent of the present disclosure, all possible changes, such as replacement, combination, modification and transform, do not exceed the scope defined by the claims of the patent application attached to the present disclosure.

What is claimed is:

1. A display system, comprising:

a supporting mechanism having a supporting surface;

a display panel, disposed on the supporting surface of the supporting mechanism; and a plurality of adjusting components, wherein each the adjusting component comprises:

a base cylinder, one end of the base cylinder being disposed on the display panel or the supporting mechanism;

an adjusting seat, telescopically disposed on the other end of the base cylinder relative to the base cylinder, wherein the adjusting seat comprises a seat stand, and an outer periphery of the seat stand has a plurality of grooves, wherein the plurality of grooves are distributed on a radial direction of an axis of the adjusting seat, and the plurality of grooves are distributed in equal-angle intervals, and the set of grooves is driven by an external force to rotate around the axis of the adjusting seat and the adjusting seat is telescopic relative to the base cylinder; and a connecting element, disposed in the adjusting seat, wherein the connecting element is connected separably to the other of the display panel or the supporting mechanism.

2. The display system according to claim 1, wherein the adjusting seat comprises a shaft rod, the base cylinder has a shaft hole, and the shaft rod extends into the shaft hole.

3. The display system according to claim 2, wherein the shaft rod has a shaft rod outer surface thread, and an inner wall of the shaft hole has a base cylinder inner surface thread corresponding to the shaft rod outer surface thread, so that the adjusting seat moves in a direction parallel to an extension direction of the base cylinder.

4. The display system according to claim 3, wherein a length of the base cylinder inner surface thread in the extension direction of the base cylinder is smaller than or equal to 50% of a length of the base cylinder, and a length of the shaft rod outer surface thread in the extension direction of the base cylinder is smaller than or equal to 85% of the length of the base cylinder inner surface thread in the extension direction of the base cylinder.

5. The display system according to claim 1, wherein the seat stand comprises a base and an outer wall; the outer wall extends from an edge of the base to a direction opposite to the base cylinder to define an accommodating space to accommodate the connecting element; and the set of grooves is distributed in the outer wall.

6. The display system according to claim 5, wherein at least one of the set of grooves penetrates through a top end and a bottom end of the outer wall.

7. The display system according to claim 5, wherein the seat stand comprises a base and an outer wall, and wherein at least one of the plurality of grooves has an opening, and the opening extends from an area between a top end and a bottom end of the outer wall to the top end of the outer wall.

8. The display system according to claim 5, wherein the seat stand comprises a base and an outer wall, and wherein at least one of the plurality of grooves has an opening, and the opening extends from an area between a top end and a bottom end of the outer wall to the bottom end of the outer.

9. The display system according to claim 1, wherein the connecting element is a magnet.

10. The display system according to claim 1, further comprising:

an adjusting jig having a first engagement part, wherein the first engagement part has at least one first clamping unit engaged with the set of grooves to rotate the adjusting seat around a first center of the first engagement part.

11. The display system according to claim 10, wherein the adjusting jig further comprises:

a main body having a first end, a second end and an extension direction, wherein the first engagement part is located on the first end; and a second engagement part located on the second end and having at least one second clamping unit for rotating around a second center of the second engagement part, wherein a first included angle is formed between the extension direction and a direction of a connecting line of the at least one first clamping unit and the first center, a second included angle is formed between the extension direction and a direction of a connecting line of the at least one second clamping unit and the second center, and the first angle is different from the second angle.

12. The display system according to claim 10, wherein the first engagement part has a first bending arm, the first bending arm defines a first opening; and the adjusting jig further comprises:

a main body having a first end, a second end and an extension direction, wherein the first engagement part is located on the first end; and a second engagement part located on the second end and having a second bending arm that defines a second opening, wherein an included angle between the extension direction and an opening direction of the first opening is different from an included angle between the extension direction and an opening direction of the second opening.

13. The display system according to claim 1, wherein the adjusting component further comprises:

a sleeve that can movably sleeve the base cylinder along an extension direction of the base cylinder, wherein the sleeve comprises at least one engagement part, and the at least one engagement part can be engaged with at least one of the set of grooves.

14. The display system according to claim 13, wherein a maximum length of the sleeve is less than or equal to a length of the base cylinder.

15. The display system according to claim 13, wherein the sleeve has an inner diameter, the base cylinder has an outer diameter, and the inner diameter of the sleeve is greater than the outer diameter of the base cylinder.

16. The display system according to claim 13, wherein an outer surface of the sleeve has a texture that increases a friction force.

17. The display system according to claim 13, wherein the sleeve is a combined sleeve formed by a plurality of components.

18. The display system according to claim 17, wherein each component of the sleeve has a separation surface, and the separation surface extends from one end of the adjacent display panel to the other end of the adjacent supporting mechanism.

19. A display system, comprising:

a supporting mechanism having a supporting surface;

a display panel, disposed on the supporting surface of the supporting mechanism; and a plurality of adjusting components, each the adjusting component comprising:

a base cylinder, one end of the base cylinder being disposed on the display panel or the supporting mechanism, wherein the base cylinder has a base cylinder outer surface thread;

an adjusting seat having a hole for the base cylinder to extend into, wherein an inner wall of the hole has an adjusting seat inner surface thread corresponding to the base cylinder outer surface thread, and a length of the adjusting component is adjusted by rotating the adjusting seat, wherein the adjusting seat has an outer wall having a plurality of grooves, and the plurality of grooves are sunken toward an interior of the adjusting seat, wherein the plurality of grooves are extended along a direction parallel to an extending direction of the base cylinder; and a connecting element, disposed on the adjusting seat, wherein the connecting element is connected separably to the other of the display panel or the supporting mechanism.

20. The display system according to claim 19, wherein a length of the base cylinder outer surface thread in an extension direction of the base cylinder is smaller than or equal to 50% of the length of the base cylinder, and a length of the adjusting seat inner surface thread in the extension direction of the base cylinder is smaller than or equal to 85% of the length of the base cylinder outer surface thread in the extension direction of the base cylinder.

21. The display system according to claim 19, wherein the outer wall defines an accommodating space to accommodate the connecting element.

* * * * *